United States Patent
Frost et al.

(10) Patent No.: US 8,907,697 B2
(45) Date of Patent: Dec. 9, 2014

(54) ELECTRICAL CHARACTERIZATION FOR A SEMICONDUCTOR DEVICE PIN

(75) Inventors: Jack Frost, Tigard, OR (US); Joseph M. Salazar, Portland, OR (US)

(73) Assignee: Teseda Corporation, Portland, OR (US)

( * ) Notice: Subject to any disclaimer, the term of this patent is extended or adjusted under 35 U.S.C. 154(b) by 468 days.

(21) Appl. No.: 13/223,059

(22) Filed: Aug. 31, 2011

(65) Prior Publication Data

US 2013/0049790 A1 Feb. 28, 2013

(51) Int. Cl.
*G01R 31/02* (2006.01)
*G01R 31/317* (2006.01)

(52) U.S. Cl.
CPC ............................. *G01R 31/31715* (2013.01)
USPC ............ 324/762.01; 324/762.02; 324/762.05; 324/750.01; 324/756.05; 324/601; 702/185; 702/117; 714/742; 714/724; 327/525; 327/63

(58) Field of Classification Search
CPC ..................... G01R 31/31924; G01R 31/3004; G01R 31/2884; G01R 31/31922; G01R 31/3008; G01R 31/318511; G01R 31/2831; G01R 35/005; G01R 31/3191; G01R 27/28; G11C 29/56; H05K 999/99; H01L 22/34; H01L 22/14
USPC ............. 324/762.01, 762.02, 762.05, 750.01, 324/750.02, 601, 756.05, 73.1; 702/185, 702/117; 714/742, 724, E11.169; 327/525, 327/63
See application file for complete search history.

(56) References Cited

U.S. PATENT DOCUMENTS

| | | | |
|---|---|---|---|
| 2,883,255 A | | 4/1959 | Anderson |
| 3,082,374 A | | 3/1963 | Buuck |
| 4,012,625 A | | 3/1977 | Bowen |
| 4,434,489 A | | 2/1984 | Blyth |
| 4,646,299 A | * | 2/1987 | Schinabeck et al. ........... 714/736 |
| 4,928,278 A | * | 5/1990 | Otsuji et al. .................. 714/700 |
| 5,490,151 A | | 2/1996 | Feger |
| 5,696,771 A | | 12/1997 | Beausang |
| 5,717,701 A | | 2/1998 | Angelotti |
| 6,185,707 B1 | | 2/2001 | Smith |
| 6,275,023 B1 | * | 8/2001 | Oosaki et al. ............ 324/756.06 |
| 6,498,473 B1 | * | 12/2002 | Yamabe ................ 324/750.01 |
| 6,618,827 B1 | | 9/2003 | Benavides |
| 6,628,141 B1 | | 9/2003 | Alt |
| 6,775,796 B2 | | 8/2004 | Finkler |
| 6,832,122 B1 | | 12/2004 | Huber |
| 6,836,136 B2 | * | 12/2004 | Aghaeepour ............ 324/762.01 |

(Continued)

OTHER PUBLICATIONS

"Per Pin Parametric Measurement Unit/Source Measure Unit," Analog Devices, Inc., 24 pages, Sep. 2005.

(Continued)

*Primary Examiner* — Tung X Nguyen
*Assistant Examiner* — Thang Le
(74) *Attorney, Agent, or Firm* — Stolowitz Ford Cowger LLP

(57) ABSTRACT

Embodiments related to electrically characterizing a semiconductor device are provided. In one example, a method for characterizing a pin of a semiconductor device is provided, the method comprising providing a test pattern to the semiconductor device. Further, the method includes adjusting a selected electrical state of a pin of the semiconductor device and measuring a value for a dependent electrical state of the pin responsive to the selected electrical state. The example method also includes generating an electrical characterization for the pin by correlating the dependent electrical state with the selected electrical state and outputting the electrical characterization for display.

15 Claims, 4 Drawing Sheets

(56) References Cited

U.S. PATENT DOCUMENTS

| | | | |
|---|---|---|---|
| 6,882,950 B1 | 4/2005 | Jennion | |
| 6,883,115 B2 | 4/2005 | Sanada | |
| 6,950,771 B1 | 9/2005 | Fan | |
| 7,012,444 B2* | 3/2006 | Kojima | 324/762.01 |
| 7,071,833 B2 | 7/2006 | Nagano | |
| 7,266,741 B2 | 9/2007 | Luk | |
| 7,320,115 B2 | 1/2008 | Kuo | |
| 7,512,508 B2 | 3/2009 | Rajski | |
| 7,568,139 B2 | 7/2009 | Dokken | |
| 7,571,422 B2 | 8/2009 | Adel | |
| 7,574,682 B2 | 8/2009 | Riviere-Cazaux | |
| 7,729,884 B2 | 6/2010 | Huang | |
| 7,752,581 B2 | 7/2010 | Lanzerotti | |
| 7,876,120 B2* | 1/2011 | Awaji et al. | 324/750.3 |
| 7,987,442 B2 | 7/2011 | Rajski | |
| 8,141,026 B1 | 3/2012 | Reilly | |
| 8,205,173 B2 | 6/2012 | Wu | |
| 8,343,781 B2 | 1/2013 | Kumar | |
| 8,412,991 B2 | 4/2013 | Ackerman | |
| 8,453,088 B2 | 5/2013 | Akar | |
| 8,539,389 B2 | 9/2013 | Akar | |
| 8,560,904 B2 | 10/2013 | Ackerman | |
| 8,626,460 B2 | 1/2014 | Kaufman et al. | |
| 2003/0046621 A1 | 3/2003 | Finkler | |
| 2003/0046624 A1* | 3/2003 | Muhtaroglu | 714/727 |
| 2003/0057990 A1* | 3/2003 | West | 324/765 |
| 2004/0049722 A1 | 3/2004 | Matsushita | |
| 2005/0066294 A1 | 3/2005 | Templeton | |
| 2005/0071659 A1 | 3/2005 | Ferguson | |
| 2005/0076316 A1 | 4/2005 | Pierrat | |
| 2005/0270165 A1 | 12/2005 | Nagano | |
| 2005/0278670 A1 | 12/2005 | Brooks | |
| 2006/0031792 A1 | 2/2006 | Zavadsky | |
| 2006/0053357 A1 | 3/2006 | Rajski | |
| 2006/0066338 A1 | 3/2006 | Rajski | |
| 2006/0066339 A1 | 3/2006 | Rajski | |
| 2006/0085768 A1 | 4/2006 | Heng | |
| 2006/0111873 A1 | 5/2006 | Huang | |
| 2006/0132165 A1* | 6/2006 | Walker et al. | 324/765 |
| 2006/0132166 A1* | 6/2006 | Walker et al. | 324/765 |
| 2006/0161452 A1 | 7/2006 | Hess | |
| 2006/0279310 A1* | 12/2006 | Walker et al. | 324/765 |
| 2007/0011519 A1 | 1/2007 | Takeda | |
| 2007/0016879 A1 | 1/2007 | Kuo | |
| 2007/0143718 A1 | 6/2007 | Abercrombie | |
| 2007/0226570 A1 | 9/2007 | Zou | |
| 2008/0040637 A1 | 2/2008 | Huang | |
| 2008/0091981 A1 | 4/2008 | Dokken | |
| 2008/0148201 A1 | 6/2008 | Lanzerotti | |
| 2008/0209365 A1 | 8/2008 | Riviere-Cazaux | |
| 2008/0284453 A1 | 11/2008 | Swenton | |
| 2009/0177936 A1 | 7/2009 | Koenemann | |
| 2009/0210183 A1 | 8/2009 | Rajski | |
| 2010/0095177 A1 | 4/2010 | Forlenza | |
| 2010/0122229 A1 | 5/2010 | Lo | |
| 2010/0164013 A1 | 7/2010 | Jaffe | |
| 2010/0306606 A1 | 12/2010 | Huang | |
| 2010/0332172 A1 | 12/2010 | Kaufman | |
| 2011/0219346 A1 | 9/2011 | Lo | |
| 2011/0231722 A1 | 9/2011 | Mukherjee | |
| 2011/0265157 A1 | 10/2011 | Ryder | |
| 2011/0276935 A1 | 11/2011 | Fouquet | |
| 2012/0079439 A1 | 3/2012 | Akar | |
| 2012/0079440 A1 | 3/2012 | Akar | |
| 2012/0079442 A1 | 3/2012 | Akar | |
| 2012/0161808 A1* | 6/2012 | Elias | 324/762.03 |
| 2013/0049790 A1 | 2/2013 | Frost | |
| 2013/0061103 A1 | 3/2013 | Ackerman | |
| 2013/0219237 A1 | 8/2013 | Ackerman | |
| 2014/0115412 A1 | 4/2014 | Ackerman | |
| 2014/0115551 A1 | 4/2014 | Akar | |

OTHER PUBLICATIONS

Kashyap, Chandramouli et al., "Silicon feedback to improve frequency of high-performance microprocessors—an overview"; Published in Proceedings ICCAD '08 Proceedings of the 2008 IEEE/ACM International Conference on Computer-Aided Design; 2008; 5 pages.

Stolowitz Ford Cowger, Listing of Related Cases, Jul. 15, 2014, 2 pages.

* cited by examiner

ELECTRICAL CHARACTERIZATION FOR A SEMICONDUCTOR DEVICE PIN

BACKGROUND

It can be difficult to screen semiconductor devices for functionality. Defects observed at the package interface may cause the entire device to fail. Previous approaches to determining whether a device is functional include wafer sort and final packaged testing. However, because the test equipment associated with such tests is often expensive, sophisticated capital equipment, the tests themselves become expensive, with the cost of the test increasing with test duration.

SUMMARY

Various embodiments are disclosed herein that relate to electrically screening semiconductor devices. For example, one embodiment provides a method for electrically characterizing a pin of a semiconductor device. The example method includes providing a test pattern to the semiconductor device. Further, the method includes adjusting a selected electrical state of a pin of the semiconductor device and measuring a value for a dependent electrical state of the pin responsive to the selected electrical state. The example method also includes generating an electrical characterization for the pin by correlating the dependent electrical state with the selected electrical state and outputting the electrical characterization for display.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Defects occurring during semiconductor manufacturing may cause functional faults in semiconductor devices. For example, manufacturing faults like open circuit defects, impurity defects, and packaging defects may cause faults potentially leading to poor device performance or device failure. Semiconductor devices may be tested at an electrical test and/or sort facility using automated test equipment (ATE) to determine if the device is logically functional. Depending on the logical function of the device, additional techniques may be used to analyze specific failure modes of the device and/or to investigate the electrical character of the device. For example, pin characterization equipment may be used to characterize various electrical properties of electrical pins of the semiconductor device. However, existing approaches to characterizing pin electrical properties generally do not provide logic function test capability.

The disclosed embodiments relate to systems and methods for electrically characterizing a semiconductor device. For example, a computer-readable storage medium excluding a signal per se and comprising instructions stored thereon that are executable by a computing device to electrically characterize pins included in the semiconductor device is disclosed. The example instructions comprise instructions to provide a test pattern to the semiconductor device via one or more of the pins, the test pattern configured to set the semiconductor device to a selected logical state prior to electrically characterizing a selected pin. The example instructions also comprise instructions to adjust an electrical state of the selected pin after the test pattern is provided to the device, generate an electrical characterization for the selected pin, and output the electrical characterization for display.

Figure 1:
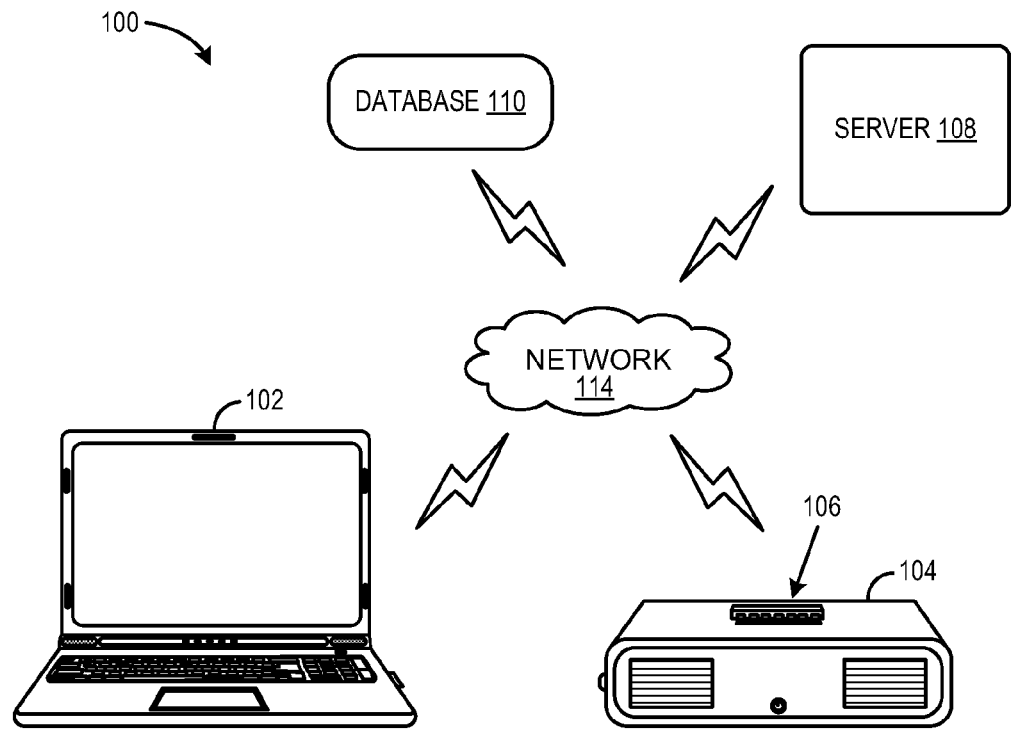
FIG. 1 schematically shows an example system for testing a semiconductor device according to an embodiment of the present disclosure.
Figure 2:
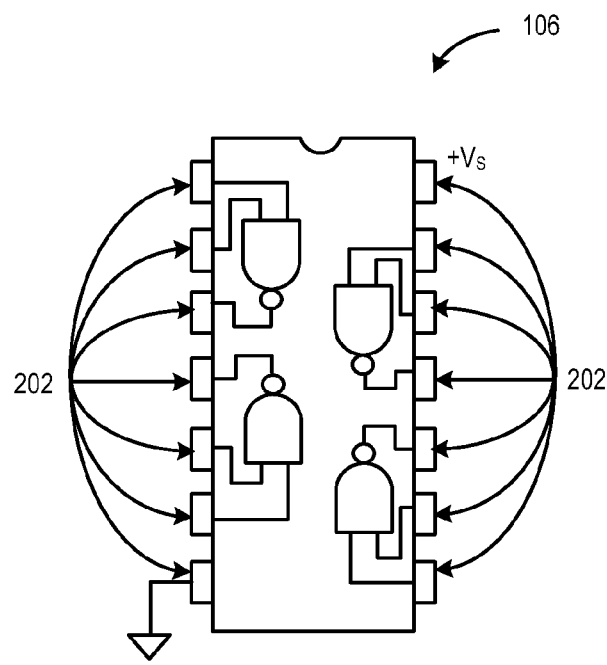
FIG. 2 schematically shows an example semiconductor device that may be tested using the system of FIG. 1.

The disclosed embodiments may provide an approach to characterize the electrical behavior of one or more pins included in a semiconductor device rapidly. Further, in some embodiments, the system and methods described herein may provide a compact approach to checking device functionality without the overhead of traditional ATE hardware. For example, in some embodiments, the hardware and software described herein may be implemented in a portable and/or compact manner FIG. 1 schematically shows an embodiment of a system 100 for testing a semiconductor device and FIG. 2 schematically shows an embodiment of a semiconductor device 106 that may be tested using system 100 of FIG. 1. Semiconductor device 106 may be virtually any suitable semiconductor device, including, digital devices, analog devices, and devices including digital and analog subsystems. As shown, semiconductor device 106 includes a plurality of pins 202. Any suitable number of pins included in semiconductor device 106 may be characterized by the embodiments described herein. For example, in some embodiments, semiconductor devices having 348 pins, 512 pins, or more pins may be characterized and tested using the described embodiments.

As shown in FIG. 1, system 100 includes a characterization computing device 102, a test unit 104, a server 108, a database 110, and a network 114. As described in more detail below, characterization computing device 102 generates an electrical characterization of one or more pins of semiconductor device 106 using data measured by test unit 104. The electrical characterization generated may be virtually any suitable electrical characterization. In some embodiments, the electrical characterization may include a direct current or voltage characterization of a pin. Other suitable electrical characterizations include, but are not limited to, continuity tests, and input leakage current measurements performed at a pin under test.

Characterization computing device 102 may receive data for characterizing semiconductor device 106 and comparing the characterization generated to characterizations for other devices (such as statistical baseline data, manufacturing specification data, device performance data, and the like) from server 108 and/or database 110 via network 114. While FIG. 1 depicts a client/server model, it will be appreciated that the client/server model is provided for illustrative purposes only, and that any suitable computing model for provisioning characterization computing device 102 with such data may be employed without departing from the scope of the present disclosure. For example, in some embodiments, a cloud computing model may be employed, while in other embodiments database 110 and test unit 104 may be included with characterization computing device 102 in a shared housing.

Figure 3:
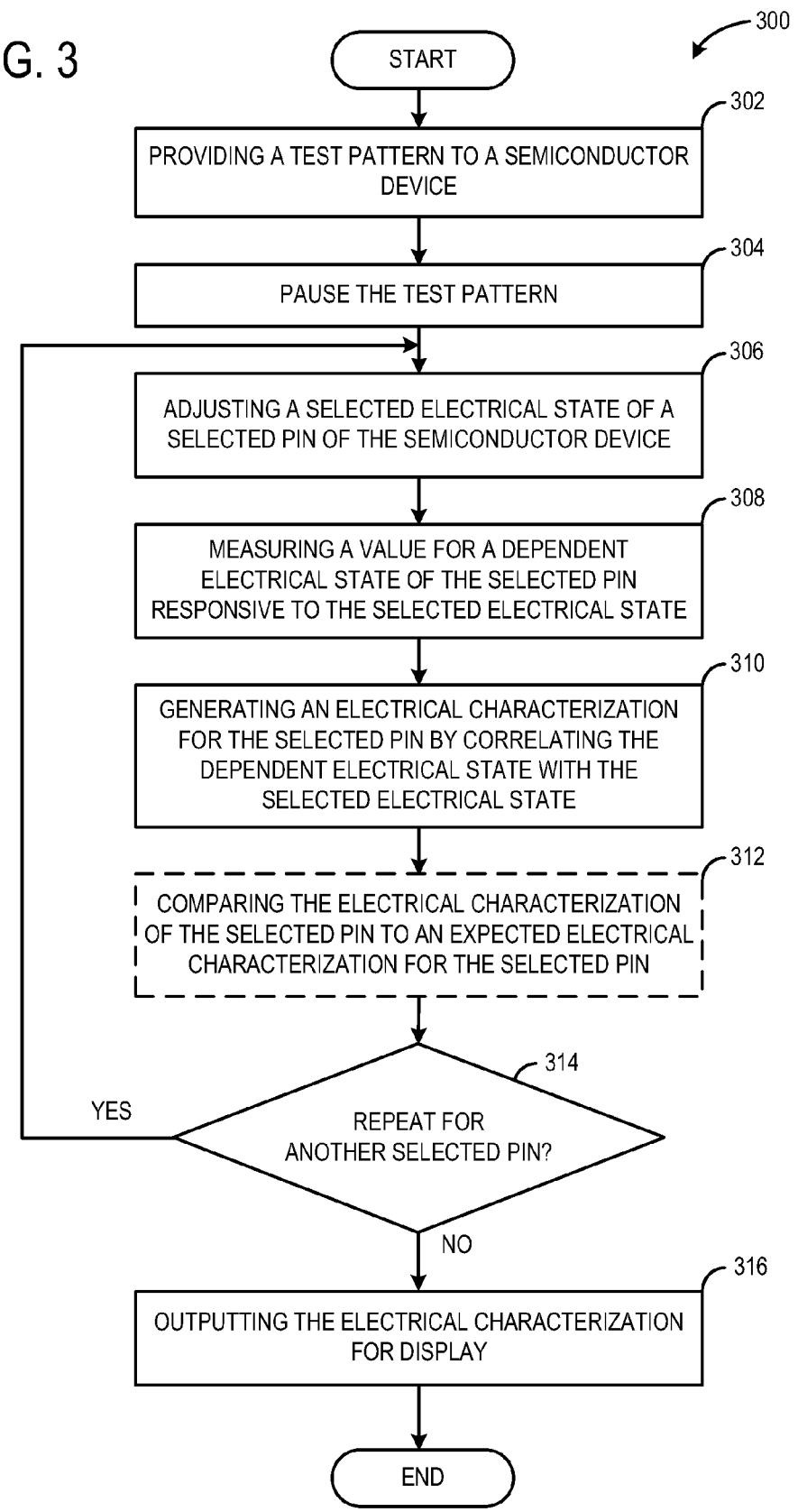
FIG. 3 shows a flowchart for a method for electrically characterizing a semiconductor device according to an embodiment of the present disclosure.

FIG. 3 shows a flowchart for an embodiment of a method 300 for electrically characterizing a semiconductor device. Method 300 comprises, at 302, providing a test pattern to a semiconductor device. The test pattern is provided to set one or more pins of the device to selected respective logical states prior to electrical characterization. For example, the test pattern may be used to set various pins of the device, other than a particular pin under test selected for characterization, to predetermined respective logical states before the particular pin is characterized. In some embodiments, the test pattern may be a sequence of 1s (e.g., logic highs) and 0s (e.g., logic lows) provided as input to the semiconductor device via various input pins, power pins, ground pins, and the like. Once the test pattern is applied, the logical state of the semiconductor device may be known, and, because the logical state of the semiconductor device may be known, the electrical characterization of the pin may be performed to determine whether the electrical characteristics of the pin are within expected tolerances.

In some embodiments, providing the test pattern to the semiconductor device may include setting one or more pins of the semiconductor device to a logic low state while a pin selected for electrical characterization is characterized. In some embodiments, setting a pin to a logic low state may include setting the pin to a D.C. voltage of 0.8 V or less, within an acceptable tolerance. In some embodiments, setting the pins to a logic low may include setting the pins to a ground state. Setting the pins to a ground state may be performed prior to performing the selected characterization techniques on the selected pin. For example, setting the semiconductor device to a ground state may be performed prior to performing a voltage-current characterization of the selected pin and/or a continuity characterization for the selected pin, as described further below.

In some other embodiments, providing the test pattern to the semiconductor device may include setting one or more pins of the semiconductor device to a logic high state while the selected pin is characterized. In some embodiments, setting such pins to a logic high state may include setting the pins to a D.C. voltage of 2.5 V, within an acceptable tolerance. For example, using a test pattern to set the semiconductor device to the powered state may enable an input leakage determination as described below.

At 304, method 300 includes pausing the test pattern while the pin selected for electrical characterization is characterized. Pausing the test pattern provides a D.C. state for characterization of the selected pin. Thus, the test pattern is paused to adjust the selected electrical state and measure the value for the dependent electrical state for the selected pin. It will be appreciated that the test pattern may be paused for any suitable period of time. In one example, the test pattern may be paused for less than 100 milliseconds while the dependent electrical state is measured.

At 306, method 300 includes adjusting a selected electrical state of the selected pin of the semiconductor device, and, at 308, measuring a value for a dependent electrical state of the selected pin responsive to the selected electrical state. For example, a test unit configured to perform an electrical measurement of the semiconductor device may adjust the selected electrical state of the selected pin and measure the dependent electrical state of the selected pin in response. It will be appreciated that selection and adjustment of the electrical state may be performed in any suitable way. For example, in some embodiments, a value for the electrical state may be selected and provided as a stimulus to the selected pin and a response of the selected pin may be detected and measured by a suitable sensor in response. The selected value may be incremented and/or indexed through a selected range of values in some embodiments, while the selected value may be a single value in some other embodiments.

At 308, method 300 includes generating an electrical characterization for the pin by correlating the dependent electrical state with the selected electrical state. For example, a correlation may be formed from one or more selected electrical state values provided to the pin may and the respective dependent electrical state values measured in response. Any suitable manner of correlating the dependent electrical state to the electrical state may be employed without departing from the scope of the present disclosure. In some embodiments, a plurality of correlations may be generated from the data along with statistical information related to the quality of the correlation, such as a correlation coefficient, for each, potentially allowing judgments to be made about outlier data points, various defect modes that may be identifiable via various correlation techniques, and so on.

Various examples of electrical characterizations that may be generated and the electrical state adjustments and dependent electrical state measurements are described below. For example, a voltage-current characterization may be generated using current measurements made in response to voltage adjustments to a selected pin. In this example, adjusting the selected electrical state of the selected pin may include adjusting a selected voltage incrementally within a selected voltage range. For example, one non-limiting voltage range may include voltages selected in the range from −1.4 V to +1.4 V selected in increments of 0.1 V. Measuring the value for the dependent electrical state of the selected pin in this example may include measuring a current value at the selected pin for each voltage setting. Once the current measurements are collected, the voltage-current characterization may be generated by suitably correlating the current measurements with their respective voltage settings. In some embodiments, generating the voltage-current relationship for the selected pin may include setting one or more pins other than the selected pin to a logic low state prior to adjusting the voltage of the selected pin. For example, each pin other than the selected pin may be set to a logic low state prior to adjusting the voltage of the selected pin. In some other embodiments, each of a plurality of pins other than the selected pin may be set to logic high and/or logic low states respectively prior to adjusting the voltage of the selected pin.

In another example, an input leakage characterization may be generated for a selected pin. In this example, adjusting the selected electrical state of the selected pin may include selecting a voltage and measuring the value for the dependent electrical state may include measuring a current value in response. For example, a selected pin may be set to a voltage of 3.3 V and a current may be measured at the selected pin. Once the current measurement is collected, the input leakage characterization may be generated by suitably correlating the current measurement with the voltage setting. In some embodiments, generating the voltage-current relationship for the selected pin may include setting one or more pins other than the selected pin to a powered state prior to adjusting the selected voltage of the selected pin. For example, each power pin other than the selected pin may be set to a powered state prior to adjusting the voltage of the selected pin.

In yet another example, a pin continuity characterization may be generated for a selected pin. In this example, adjusting the selected electrical state of the selected pin may include selecting a current and measuring the value for the dependent electrical state of the selected pin may include measuring a voltage value in response. For example, a selected pin may be set to a current of −1.0 μA and a voltage may be measured at the selected pin. Once the voltage measurement is collected, the continuity characterization may be generated by suitably correlating the voltage measurement with the current setting. In some embodiments, generating the voltage-current relationship for the selected pin may include setting one or more pins other than the selected pin to a logic low state prior to adjusting the selected current. For example, each pin other than the selected pin may be set to an unpowered state prior to adjusting the current of the selected pin.

At 310, method 300 may optionally include comparing the electrical characterization for the selected pin to an expected or reference electrical characterization for the selected pin. Comparing the characterization for the selected pin to an expected characterization may provide an approach for determining whether the selected pin has acceptable pin characteristics. Such judgments may be made by comparing inflection points, slopes, and/or other suitable features of the generated characterization and/or the correlation underlying the generated characterization to the reference. Further, comparison of the characterization generated for the selected pin to a reference characterization may provide an approach for diagnosing potential failure mechanisms if the selected pin is faulty. For example, differences between the characterizations for the selected pin and the expected electrical characterization may indicate further tests that may be performed, potential causes for the fault, and so on. Any suitable expected electrical characterization may be used for comparison without departing from the scope of the present disclosure. In some embodiments, the expected electrical characterization may have been generated from a previously tested pin on the device under test, from a reference device, from a simulation or theory, from a relevant industry standard, and the like.

In some embodiments, the semiconductor device may include a plurality of pins that may be selected for characterization. In such embodiments, method 300 may be repeated to characterize the additional selected pins. Accordingly, at 312, method 300 includes determining if portions of method 300 are to be repeated for another pin under test. If an additional pin is selected for characterization, method 300 returns to 304.

In some embodiments, a plurality of pins of the semiconductor device may be tested according to a predetermined sequence. It will be appreciated that any suitable sequence may be used for characterizing the pins. For example, the pins may be tested according to a suitable pin identifier.

If no additional pins are selected for characterization, method 300 continues to 314. At 314, method 300 includes, at 314, outputting the electrical characterization for display. Virtually any suitable display output may be employed without departing from the scope of the present disclosure. In some embodiments, the displayed output may be presented in a customizable format and/or in various graphical and/or tabular displays as described below.

Figure 4:
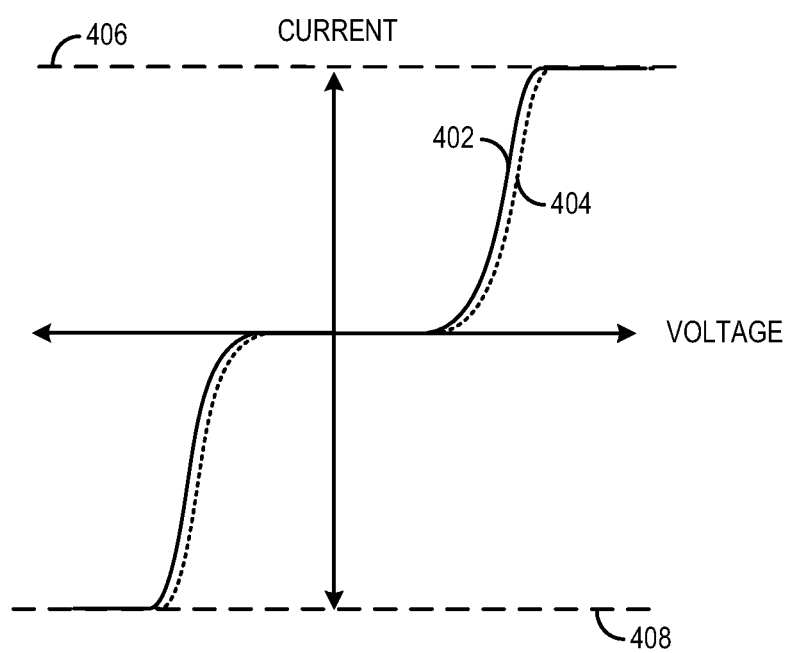
FIG. 4 shows a graphical representation of a voltage-current characterization that may be output for display according to an embodiment of the present disclosure.

In some embodiments, a graphical comparison of generated and expected electrical characterizations for a selected pin or pins may be output for display. FIG. 4 schematically shows an embodiment of a graphical representation of a generated electrical characterization 402 for a selected pin and an example expected electrical characterization 404 associated with that pin. The graphical representation shown in FIG. 4 illustrates an example voltage-current relationship for the selected pin. As shown in FIG. 4, generated electrical characterization 402 overlays expected electrical characterization 404 on a common axis. Presenting electrical characterizations 402 and 404 in this manner may make it visually apparent whether the electrical characteristics of the selected pin are within an acceptable tolerance of a reference electrical characteristic. FIG. 4 also shows a high threshold 406 and a low threshold 408. In some embodiments, high threshold 406 may represent an upper rail for protecting the test unit from excess current while low threshold 408 may represent a lower rail from excess current or vice versa.

Continuing with FIG. 3, in some embodiments, an electrical characterization may be output in tabular form. For example, a data table output for display may include the electrical characterization and one or more values for the selected electrical state of the selected pin or pins and corresponding values measured for the dependent electrical state of the selected pin or pins from which the electrical characterization was generated. Further, the data table may include comparisons to expected electrical characterization for one or more selected pins, information about a test pattern provided to the device under test prior to performing the characterization, and so on.

It will be appreciated that method 300 is provided by way of example and as such is not meant to be limiting. Method 300 may include additional or alternative steps that those shown in FIG. 3. Further, the methods described herein may be performed by any suitable hardware and/or software, including the hardware described herein.

Figure 5:
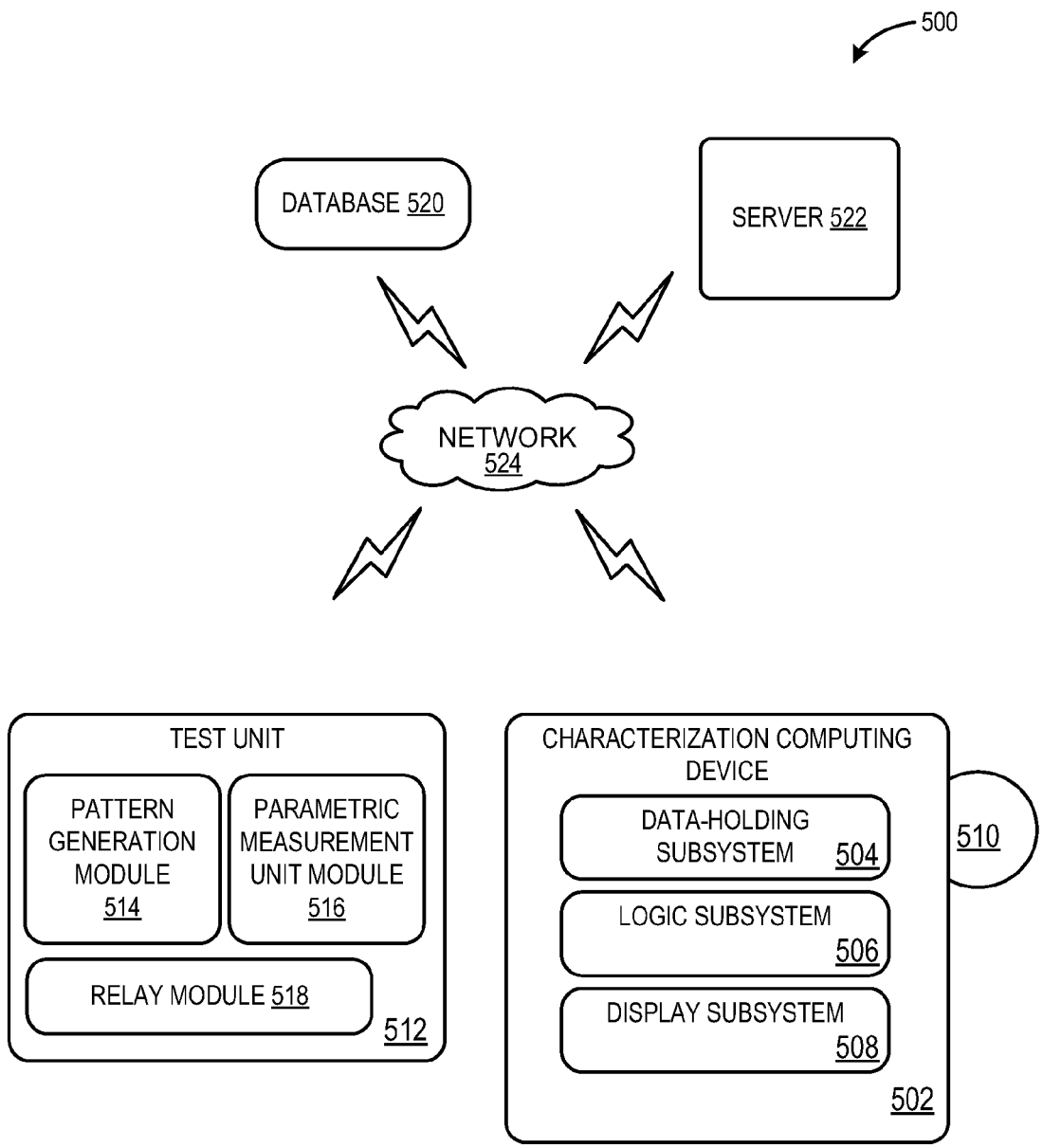
FIG. 5 schematically shows another example system for testing a semiconductor device according to an embodiment of the present disclosure.

FIG. 5 schematically shows an embodiment of a system 500 for testing a semiconductor device including characterization computing device 502 and test unit 512. Characterization computing device 502 includes a data-holding subsystem 504, a logic subsystem 506, and a display subsystem 508. Instructions held in data-holding subsystem 504 and executed by logic subsystem 506 may be used to perform various method described herein. Data-holding subsystem 504 may include one or more physical, non-transitory, devices configured to hold data and/or instructions excluding a signal per se that are executable by logic subsystem 506 to implement the methods and processes described herein. For example, data-holding subsystem 504 may include one or more hard disks, flash drives, memory devices, caches, and/or registers configured to hold data and/or instructions.

Logic subsystem 506 may include one or more physical devices configured to execute one or more instructions stored in data-holding subsystem 504. For example, logic subsystem 506 may include one or more processors that are configured to execute software instructions.

Display subsystem 508 may be used to present the output described herein in a manner so that the output may be transformed into a visually cognizable form. Display subsystem 508 may include any suitable display device, which may be combined in a shared enclosure with data-holding subsystem 504 and logic subsystem 506 or which may be include one or more peripheral display devices.

FIG. 5 also shows removable computer-readable storage media 510, which may be used to store and/or transfer data and/or instructions executable to implement the methods and processes described herein. It will be appreciated that any suitable removable computer-readable storage media excluding a signal per se may be employed without departing from the scope of the present disclosure. Non-limiting examples include DVDs, CD-ROMs, floppy discs, and flash drives.

As shown in FIG. 5, test unit 512 includes a pattern generation module 514, a parametric measurement unit module 516, and a relay module 518. Pattern generation module 514 is configured to provide a test pattern to the semiconductor device. Thus, pattern generation module 514 may be used to provide a test pattern to the semiconductor device prior to adjusting an electrical state of a pin, to set logical states of the device, and so on.

Parametric measurement unit module 516 is configured to adjust the selected electrical state and measure the dependent electrical state of the pin. Thus, parametric measurement unit module 516 may be used to select and adjust suitable voltage and current values and to detect and collect suitable current and voltage measurements in response.

Relay module 518 is configured to switchably electrically couple pattern generation module 514 or parametric measurement unit module 516 to the pin. Because a logical state may not be set for a pin concurrent with electrical characterization, in some embodiments, relay module 518 may be employed to switch the active electrical communication of the pin between pattern generation module 514 and parametric measurement unit module 516 upon selection of that pin for electrical characterization. Thus, that pin may be able to be selected and deselected for electrical characterization and pattern testing, respectively, without being physically disconnected from test unit 512.

Further, as shown in FIG. 5, characterization computing device 502 and/or test unit 512 may be operatively connected to a server 522 and/or database 520 via a network 524. Database 520 may store one or more expected electrical characterizations used for comparative purposes as described herein. Database 520 may be any suitable database. For example, database 520 may be a remote database stored on server 522 in some embodiments, while in some other embodiments database 520 may be stored at characterization computing device 502 and/or test unit 512, for example. Further, in some embodiments, database 520 may be accessible via a cloud computing service, for example. It will be appreciated that database 520 may be stored on any suitable storage medium, and further, may be accessible via any suitable communicative pathway.

In this way, the semiconductor testing system described herein may generate an electrical characterization of one or more pins by adjusting an electrical state of a pin and measuring the corresponding dependent characteristic of that pin. By first providing the test pattern, a logical state of the pin prior to measuring an electrical characteristic may be known. In this way, the electrical characteristic of the pin may be predictable and the semiconductor device may be screened for faults.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method for electrically characterizing a pin of a semiconductor device, the method comprising:
providing a test pattern to the semiconductor device;
adjusting a selected electrical state of the pin of the semiconductor device;
measuring a value for a dependent electrical state of the pin responsive to the selected electrical state; and
generating an electrical characterization for the pin by correlating the dependent electrical state with the selected electrical state; and outputting the electrical characterization for display;
wherein adjusting the selected electrical state includes adjusting a voltage incrementally within a selected voltage range, wherein measuring the value for the dependent electrical state includes measuring a current at each voltage increment in response to adjusting the voltage incrementally, and wherein generating the electrical characterization for the pin includes generating a voltage-current relationship.

2. The method of claim 1, wherein the selected electrical state is adjusted after the test pattern is provided to the semiconductor device.

3. The method of claim 1, further comprising setting another pin to a logic low state prior to adjusting the selected electrical state of the pin.

4. A method for electrically characterizing a pin of a semiconductor device, the method comprising:
providing a test pattern to the semiconductor device;
adjusting a selected electrical state of the pin of the semiconductor device;
measuring a value for a dependent electrical state of the pin responsive to the selected electrical state;
generating an electrical characterization for the pin by correlating the dependent electrical state with the selected electrical state; and
outputting the electrical characterization for display;
wherein adjusting the selected electrical state includes adjusting a current incrementally, wherein measuring the value for the dependent electrical state includes measuring a voltage in response to adjusting the current incrementally, and wherein generating the electrical characterization includes determining a continuity of the pin and generating a voltage-current relationship for the pin.

5. The method of claim 1, further comprising setting the semiconductor device to a powered state prior to adjusting the selected electrical state of the pin.

6. The method of claim 5, further comprising measuring a value for a current of the pin, wherein generating the electrical characterization includes determining an input leakage for the pin.

7. The method of claim 1, further comprising comparing the electrical characterization for the pin to an expected electrical characterization for the pin, and wherein outputting the electrical characterization for display includes outputting a graphical representation of the electrical characterization for the pin and a graphical representation of the expected electrical characterization for the pin.

8. The method of claim 1, wherein the semiconductor device includes a plurality of pins, the method further comprising generating electrical characterizations for each of the plurality of pins.

9. A non-transitory computer-readable storage medium comprising instructions stored thereon that are executable by a computing device to electrically characterize one or more pins of a semiconductor device, the instructions comprising instructions to:
provide a test pattern to the semiconductor device via one or more of the pins, the test pattern configured to set the semiconductor device to a selected logical state prior to electrically characterizing a selected one of the pins;

adjust an electrical state of the selected one of the pins after the test pattern is provided to the device, wherein the instructions to adjust the electrical state include instructions to adjust a voltage incrementally;

generate an electrical characterization for the selected one of the pins, wherein the instructions to generate the electrical characterization include instructions to measure a current in response to adjusting the voltage incrementally;

generate a voltage-current relationship for the selected one of the pins; and output the electrical characterization for display.

10. The computer-readable storage medium of claim 9, wherein the instructions to generate the electrical characterization further comprise instructions to measure a dependent direct current electrical state of the selected one of the pins.

11. The computer-readable storage medium of claim 9, further comprising instructions to compare the electrical characterization for the selected one of the pins to an expected electrical characterization for the selected one of the pins, and wherein the instructions to output the electrical characterization for display include instructions to output a graphical representation of the electrical characterization and a graphical representation of the expected electrical characterization.

12. The computer-readable storage medium of claim 11, further comprising instructions to determine whether the electrical characterization is within a predetermined tolerance of the expected electrical characterization.

13. The computer-readable storage medium of claim 9, wherein the selected one of the pins is a first pin and wherein the instructions further comprise, after the instructions to generate the electrical characterization of the first pin, instructions to adjust an electrical state of a second pin and instructions to generate an electrical characterization of the second pin.

14. A non-transitory computer-readable storage medium comprising instructions stored thereon that are executable by a computing device to electrically characterize one or more pins of a semiconductor device, the instructions comprising instructions to:

provide a test pattern to the semiconductor device via one or more of the pins, the test pattern configured to set the semiconductor device to a selected logical state prior to electrically characterizing a selected one of the pins;

adjust an electrical state of the selected one of the pins after the test pattern is provided to the semiconductor device; and generate an electrical characterization for the selected one of the pins, wherein the instructions to adjust the electrical state include instructions to adjust a current incrementally and wherein the instructions to generate the electrical characterization include instructions to measure a voltage in response to adjusting the current incrementally and to generate a voltage-current relationship for the selected one of the pins.

15. The method of claim 1, wherein the voltage incrementally adjusted is input to the pin.

* * * * *